US006998930B2

(12) United States Patent
Tabatchnick et al.

(10) Patent No.: US 6,998,930 B2
(45) Date of Patent: Feb. 14, 2006

(54) MINIATURIZED PLANAR MICROSTRIP BALUN

(75) Inventors: Justin Tabatchnick, Pollock Pines, CA (US); Jeffrey Johnson, Citrus Heights, CA (US); B Preetham Kumar, Davis, CA (US); Gopal Thakkar, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 24 days.

(21) Appl. No.: 10/880,968

(22) Filed: Jun. 30, 2004

(65) Prior Publication Data

US 2006/0001502 A1 Jan. 5, 2006

(51) Int. Cl.
*H01P 5/10* (2006.01)
*H03H 11/32* (2006.01)

(52) U.S. Cl. ...................................... 333/26; 333/24 C

(58) Field of Classification Search ............. 333/24 C, 333/25, 26; 324/322; 330/302; 336/232
See application file for complete search history.

(56) References Cited

U.S. PATENT DOCUMENTS 5,357,213 A * 10/1994 Michel et al. .............. 330/286
6,750,652 B1 * 6/2004 Weyers et al. .............. 324/318
6,765,469 B1 * 7/2004 Sortor ......................... 336/200

OTHER PUBLICATIONS

Tang, C W., "LTCC-MLC Chip-Type Balun Realized by LC Resonance Method", *Electronics Letters*, 38, Issue 11,(2002),519-520.

Tang, Ching-Wen, et al., "Using Buried Capacitor in LTCC-MLC Balun", *Electronics Letters*, 38, Issue 15,(2002),801-803.

* cited by examiner

*Primary Examiner*—Dean Takaoka
(74) *Attorney, Agent, or Firm*—The Law Offices of John C. Scott, LLC

(57) ABSTRACT

A miniaturized planar microstrip balun includes first and second microstrip coupling segments that are considerably shorter than a quarter of a guide wavelength ($\lambda_g/4$ ). In at least one embodiment, a microstrip balun is provided that does not require the use of lumped circuit elements or short circuit terminations.

26 Claims, 2 Drawing Sheets

MINIATURIZED PLANAR MICROSTRIP BALUN

TECHNICAL FIELD

The invention relates generally to balun circuits and, more particularly, to microstripline balun circuits.

DETAILED DESCRIPTION

Figure 1:
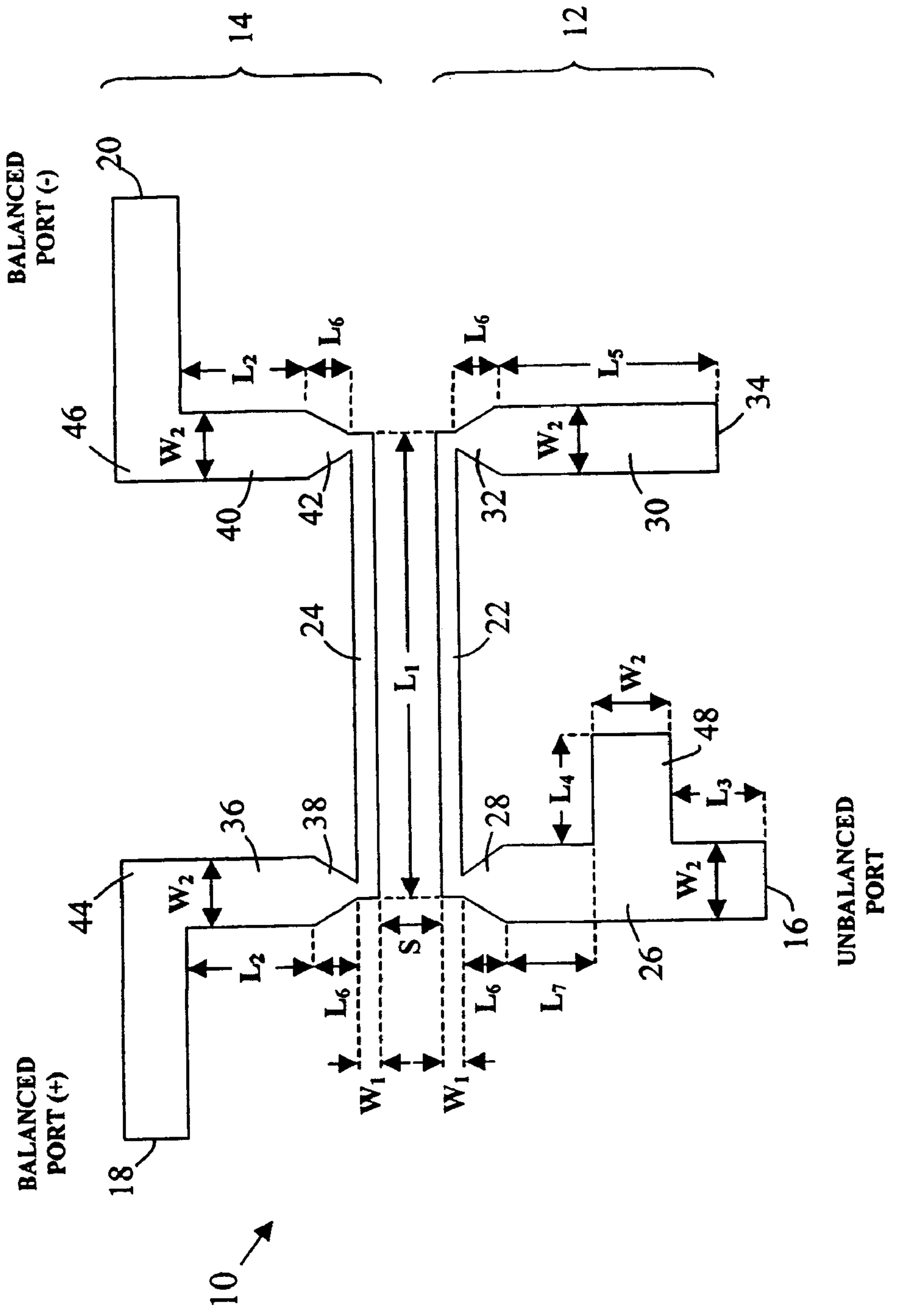
FIG. 1 is a diagram illustrating an example circuit layout for a planar microstrip balun circuit in accordance with an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

A balun is a circuit that is used to couple a balanced device or line to an unbalanced device or line. There are a wide variety of different circuit topologies that may be used to achieve a balun circuit. Many of these balun circuit topologies involve a significant amount of assembly time to achieve an operative circuit. Even balun circuit topologies that make use of microstripline technology typically require the addition of lumped element components to the microstrip circuitry. Many of these microstrip balun circuits of the past also require that one or more lines in the structure be short circuited, which typically requires additional assembly time. Many balun circuit topologies are also very large and may take up a relatively large amount of space within an implementing system. For example, microstrip baluns of the past that utilize coupled lines to achieve a balanced to unbalanced transformation are typically a minimum of a quarter of a guide wavelength long in the coupling region.

FIG. 1 is a diagram illustrating an example layout 10 for a planar microstrip balun circuit in accordance with an embodiment of the present invention. The layout 10 illustrates a metallization pattern that may be deposited on a surface of a substrate material. The substrate may include, for example, a commercially available dielectric board material (although other types of substrate may alternatively be used). In at least one embodiment of the invention, for example, a CuClad® dielectric board material, manufactured by Arlon, is used as the substrate. Other dielectric board materials may alternatively be used. The substrate may have a ground plane on an opposite side from the circuit layout 10. Techniques for forming microstrip circuitry from metal clad board materials, as well as other types of substrate, are well known in the art. To simplify illustration, the layout 10 of FIG. 1 is not drawn to scale.

With reference to FIG. 1, the circuit layout 10 includes two separate metallization components; that is, a first metallization component 12 and a second metallization component 14. The first and second metallization components 12, 14 are conductively isolated from one another. However, as will be described in greater detail, portions of the first and second metallization components 12, 14 will be electromagnetically coupled to one another during circuit operation. As illustrated, the first metallization component 12 may define an unbalanced port of the balun at a node 16 thereof. An unbalanced device (e.g., a device having a single ended input or output, etc.) or line may be connected to the balun at the unbalanced port (e.g., between the node 16 of the first metallization component 12 and a ground structure). Conversely, the second metallization component 14 may define two balanced ports of the balun (e.g., at nodes 18 and 20). A balanced device or line may be connected across the two balanced ports of the balun.

The first metallization component 12 includes a first coupling segment 22 located in a central portion thereof. The first metallization component 12 also includes a first transmission line segment 26 connected between the node 16 and one end of the first coupling segment 22. The first transmission line segment 26 has a significantly wider line width than the first coupling segment 22. Therefore, a transition 28 having a tapered line width may be used between the first transmission line segment 26 and the first coupling segment 22. The first metallization component 12 further includes a second transmission line segment 30 that is connected to an opposite end of the first coupling segment 22. A transition 32 having a tapered line width may be used between the second transmission line segment 30 and the first coupling segment 22. The second transmission line segment 30 is left open circuited at a distal end 34 thereof. As shown, the first and second transmission line segments 26, 30 may be perpendicular (at least approximately) to the first coupling segment 22.

The second metallization component 14 includes a second coupling segment 24 located in a central portion thereof. A third transmission line segment 36 is connected between the node 18 of the second metallization component 14 and one end of the second coupling segment 24. A transition 38 having a tapered line width may be used between the third transmission line segment 36 and the second coupling segment 24. Similarly, a fourth transmission line segment 40 is connected between the node 20 of the second metallization component 14 and the opposite end of the second coupling segment 24. A transition 42 having a tapered line width may be used between the fourth transmission line segment 40 and the second coupling segment 24. As illustrated, portions of the third and fourth transmission line segments 36, 40 that are closest to the second coupling segment 24 may be perpendicular thereto (at least approximately). The third and fourth transmission line segments 36, 40 may also have respective 90 degree bends 44, 46 at a point along the length thereof. Although bends are not necessary, they may be desired to appropriately position the balanced ports. Whether or not bends are used, the two balanced ports should be phase matched.

As illustrated in FIG. 1, the first and second coupling segments 22, 24 are substantially parallel to one another. In addition, the first and second coupling segments 22, 24 are separated from one another by a distance S that is selected to provide a desired level of coupling between the segments 22, 24. In microstrip balun structures of the past that utilize coupled lines, the length of the coupling region is typically at least one quarter of a guide wavelength. In accordance with the present invention, baluns may be provided that have coupling regions that are significantly shorter than a quarter guide wavelength (e.g., one eighth guide wavelength and less). These relatively short coupling lengths may be achieved using at least one, and possibly both, of the following two design features. In the first design feature, because the input stub (represented by second transmission line segment 30 in FIG. 1) is open circuited, a reflected signal is generated that results in "double" coupling to the other side of the balun. In the second design feature, the transition from a relatively narrow coupling segment (e.g., first coupling segment 22 in FIG. 1) to a relatively wide transmission line segment or segments (e.g., second transmission line segment 30 in FIG. 1) causes an increase in capacitance that makes the coupling segment appear longer. In at least one embodiment of the present invention, the lengths (L1) of the first and second coupling segments 22, 24 are less than one twelfth of a guide wavelength at the center frequency of the balun circuit.

The first transmission line segment 26 of the first metallization component 12 of the circuit layout 10 has an open circuit stub 48 disposed along a length thereof. The purpose of the open circuit stub 48 is to impedance match the balun to a predetermined characteristic impedance (e.g., 50 ohms) at the unbalanced port. In the illustrated embodiment, the first, second, third, and fourth transmission line segments 26, 30, 36, 40, and the open circuit stub 48 each have the same line width (W2) and characteristic impedance. Similarly, the first and second coupling segments 22, 24 each have the same line width (W1) and characteristic impedance. The characteristic impedance of the coupling segments 22, 24 is significantly larger than the characteristic impedance of the transmission line segments 26, 30, 36, 40. As described above, the transition from the narrow coupling region to the wider transmission line region creates an added, distributed, shunt capacitance to ground that increases the apparent length of the coupling region. In at least one embodiment, the line width of the transmission line segments may be 3 or more times the line width of the coupling segments.

In one implementation, a balun having a center frequency of approximately 2.4 GHz was developed using a CuClad® board material having a relative permittivity ($\epsilon_r$) of 2.17, a dielectric thickness of 20 mils, an upper and lower conductor thickness of 2 mils, and a conductor conductivity of $4.1\times10^7$ Siemens/meter (copper). The dimensions of the various elements of the layout 10 of FIG. 1 in this implementation are listed in Table 1 below:

TABLE 1

| | |
|---|---|
| L1 | 360 mils |
| L2 | 100 mils |
| L3 | 100 mils |
| L4 | 200 mils |
| L5 | 200 mils |
| L6 | 100 mils |
| L7 | 25 mils |
| W1 | 16 mils |
| W2 | 100 mils |
| S | 8 mils |

The overall dimensions of the resulting balun circuit is approximately 400 mils×400 mils. The implementation described above has been tested and found to achieve the results listed in Table 2 below at the center frequency of 2.4 GHz.

TABLE 2

| | |
|---|---|
| Coupling from unbalanced port to balanced port (+) | 7.9 dB |
| Coupling from unbalanced port to balanced port (−) | 8.5 dB |
| Phase Balance (between balanced ports) | 180.4 degrees |
| VSWR (unbalanced port) | 8.92 |
| VSWR (balanced port (+)) | 3.67 |
| VSWR (balanced port (−)) | 3.92 |

The above-described results were achieved without the addition of any lumped element components to the balun circuit. In addition, no short circuit terminations were used, which are typically more difficult to realize (from a labor standpoint) during circuit assembly than open circuit terminations.

Figure 2:
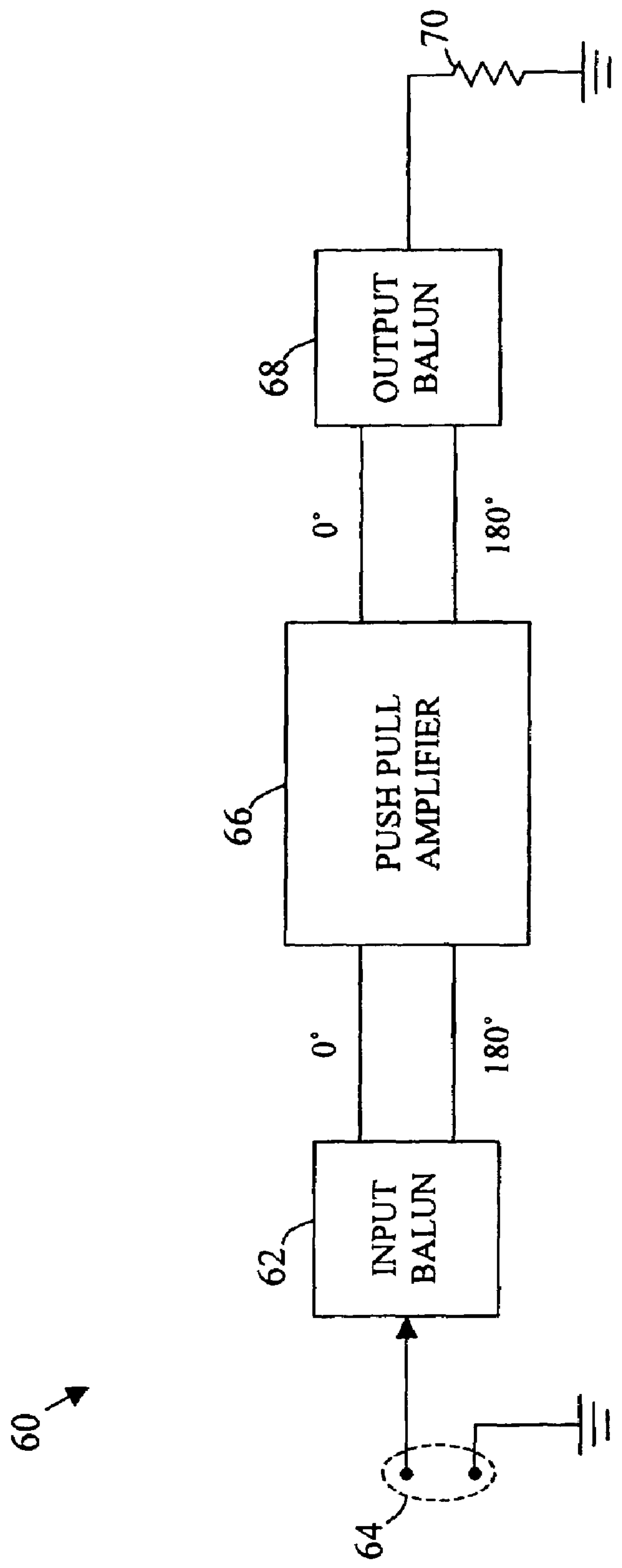
FIG. 2 is a block diagram illustrating an example amplification system utilizing planar microstrip baluns in accordance with an embodiment of the present invention.

A microstrip balun in accordance with the present invention maybe packaged as an individual balun circuit or it may be made part of a larger system. In at least one embodiment, a balun in accordance with the present invention may be implemented on the same substrate as the devices, circuits, or structures for which it is providing a transformation. FIG. 2 is a block diagram illustrating an example amplification system 60 in accordance with an embodiment of the present invention that uses two of the inventive balun circuits. An input balun 62 is used to connect a single-ended line 64 to a balanced input of a push pull amplifier 66. An output balun 68 is then used to connect a balanced output of the push pull amplifier 66 to an unbalanced load 70. In at least one embodiment, the input balun 62, the push-pull amplifier 66, and the output balun 68 are all implemented on a common substrate. Other circuitry may also be implemented on the substrate. In some embodiments, only one of the input balun 62 and the output balun 68 may be needed. As will be appreciated, baluns in accordance with the present invention may be used with a wide variety of different devices, circuits, and components including, for example, other types of amplifiers, mixers, antenna elements, differential transmitter to patch antenna, single ended transceiver to dipole antenna, single ended automated test equipment (ATE) tester to differential device input/outputs (I/Os), and/or others.

In the foregoing detailed description, various features of the invention are grouped together in one or more individual embodiments for the purpose of streamlining the disclosure. This method of disclosure is not to be interpreted as reflecting an intention that the claimed invention requires more features than are expressly recited in each claim. Rather, as the following claims reflect, inventive aspects may lie in less than all features of each disclosed embodiment.

Although the present invention has been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A microstrip balun comprising:

a substrate;

a first metallization component on a first surface of said substrate, said first metallization component including a first coupling segment; and a second metallization component on said first surface of said substrate, said second metallization component including a second coupling segment, wherein said first and second coupling segments are proximate to and substantially parallel to one another so that electromagnetic coupling occurs between said first and second coupling segments during operation of said balun, wherein said first and second coupling segments are each less than one eighth of a guide wavelength long at a center frequency of said microstrip balun.

2. The microstrip balun of claim 1, wherein:

said first metallization component includes a first transmission line segment between one end of said first coupling segment and an unbalanced port of said microstrip balun.

3. The microstrip balun of claim 2, wherein:

said first transmission line segment has a line width that is at least three times wider than a line width of said first coupling segment.

4. The microstrip balun of claim 2, wherein:

said first metallization component includes an open circuit stub connected along a length of said first transmission line segment.

5. The microstrip balun of claim 2, wherein:

said first transmission line segment is substantially perpendicular to said first coupling segment.

6. The microstrip balun of claim 2, wherein:

said first metallization component includes a transition having a tapered line width connecting said first transmission line segment to said one end of said first coupling segment.

7. The microstrip balun of claim 2, wherein:

said first metallization component further includes a second transmission line segment conductively coupled to an opposite end of said first coupling segment, said second transmission line segment having an open circuit termination at a distal end thereof.

8. The microstrip balun of claim 6, wherein:

said second transmission line segment is substantially perpendicular to said first coupling segment.

9. The microstrip balun of claim 6, wherein:

said first metallization component includes a transition having a tapered line width connecting said second transmission line segment to said opposite end of said first coupling segment.

10. The microstrip balun of claim 1, wherein:

said second metallization component includes:

a third transmission line segment between one end of said second coupling segment and a first balanced port of said microstrip balun; and a fourth transmission line segment between an opposite end of said second coupling segment and a second balanced port of said microstrip balun.

11. The microstrip balun of claim 10, wherein:

said third and fourth transmission line segments are substantially perpendicular to said second coupling segment at least in portions of said third and fourth transmission line segments that are closest to said second coupling segment.

12. The microstrip balun of claim 10, wherein:

said second metallization component includes:

a first transition having a tapered line width connecting said third transmission line segment to said one end of said second coupling segment; and a second transition having a tapered line width connecting said fourth transmission line segment to said opposite end of said second coupling segment.

13. The microstrip balun of claim 1, wherein:

said center frequency of said microstrip balun is approximately 2.4 GHz.

14. The microstrip balun of claim 1, wherein:

said first and second coupling segments are each less than one twelfth of a guide wavelength long at said center frequency of said balun.

15. The microstrip balun of claim 1, wherein:

said substrate has a ground plane on a second surface thereof, said second surface being on an opposite side of said substrate from said first surface.

16. The microstrip balun of claim 1, wherein:

said balun is operational without any lumped circuit elements connected to either said first or second metallization components.

17. An amplification system comprising:

an amplifier having first and second balanced input ports; and a micro strip balun having first and second balanced ports connected to said first and second balanced input ports of said amplifier, said micro strip balun including:

a substrate;

a first metallization component on a first surface of said substrate, said first metallization component including a first coupling segment; and a second metallization component on said first surface of said substrate, said second metallization component including a second coupling segment, wherein said first and second coupling segments are proximate to and substantially parallel to one another so that electromagnetic coupling occurs between said first and second coupling segments during operation of said balun wherein said first and second coupling segments are each less than one eighth of a guide wavelength long at a center frequency of said micro strip balun;

wherein said first metallization component includes an unbalanced input that acts as an input of said amplification system.

18. The amplification system of claim 17, wherein:

said amplifier is a push pull amplifier.

19. The amplification system of claim 17, wherein:

said amplifier is situated on said first surface of said substrate.

20. The amplification system of claim 17, wherein:

said amplifier further includes first and second balanced output ports;

said microstrip balun is a first microstrip balun; and said amplification system further includes a second microstrip balun having first and second balanced ports connected to said first and second balanced output ports of said amplifier, said second microstrip balun comprising:

a third metallization component on said first surface of said substrate, said third metallization component including a third coupling segment; and a fourth metallization component on said first surface of said substrate, said fourth metallization component including a fourth coupling segment, wherein said third and fourth coupling segments are proximate to and substantially parallel to one another so that electromagnetic coupling occurs between said third and fourth coupling segments during operation of said second microstrip balun, wherein said third and fourth coupling segments are each less than one eighth of a guide wavelength long at a center frequency of said second microstrip balun;

wherein said third metallization component includes an unbalanced output that acts as an output of said amplification system.

21. A method comprising:

connecting an unbalanced line to an unbalanced port of a microstrip balun, said microstrip balun including:

a substrate;

a first metallization component on a first surface of said substrate, said first metallization component including a first coupling segment; and a second metallization component on said first surface of said substrate, said second metallization component including a second coupling segment, wherein said first and second coupling segments are proximate to and substantially parallel to one another so that electromagnetic coupling occurs between said first and second coupling segments during operation of said balun, wherein said first and second coupling segments are each less than one eighth of a guide wavelength long at a center frequency of said microstrip balun; and connecting a balanced line to first and second balanced ports of said microstrip balun.

22. The method of claim 21, wherein:

said first metallization component includes a first transmission line segment between one end of said first coupling segment and said unbalanced port of said microstrip balun.

23. The method of claim 22, wherein:

said first metallization component includes an open circuit stub connected along a length of said first transmission line segment.

24. The method of claim 22, wherein:

said first metallization component includes a transition having a tapered line width connecting said first transmission line segment to said one end of said first coupling segment.

25. The method of claim 21, wherein:

said first metallization component further includes a second transmission line segment conductively coupled to an opposite end of said first coupling segment, said second transmission line segment having an open circuit termination at a distal end thereof.

26. The method of claim 25, wherein:

said first metallization component includes a transition having a tapered line width connecting said second transmission line segment to said opposite end of said first coupling segment.

* * * * *